United States Patent
Song et al.

(10) Patent No.: US 8,173,485 B2
(45) Date of Patent: May 8, 2012

(54) METHOD OF MANUFACTURING ORGANIC LIGHT EMITTING DEVICE

(75) Inventors: Alex Song, Suwon-si (KR); Nam-Choul Yang, Suwon-si (KR); Min-Chul Suh, Suwon-si (KR); Seong-Taek Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 64 days.

(21) Appl. No.: 12/510,939

(22) Filed: Jul. 28, 2009

(65) Prior Publication Data
US 2010/0029028 A1 Feb. 4, 2010

(30) Foreign Application Priority Data
Jul. 30, 2008 (KR) .................. 10-2008-0074712

(51) Int. Cl.
*H01L 51/56* (2006.01)
(52) U.S. Cl. .................. 438/99; 257/E51.018
(58) Field of Classification Search .......... 257/40, 257/E51.018–E51.022; 313/504; 438/99
See application file for complete search history.

(56) References Cited

U.S. PATENT DOCUMENTS

| | | | | |
|---|---|---|---|---|
| 4,090,006 | A | * | 5/1978 | Havas et al. .................. 428/81 |
| 4,284,706 | A | * | 8/1981 | Clecak et al. ................. 430/191 |
| 5,705,432 | A | * | 1/1998 | Lee et al. ...................... 438/606 |
| 2004/0018797 | A1 | * | 1/2004 | Murakami et al. .............. 445/24 |
| 2004/0169009 | A1 | * | 9/2004 | Kitamura et al. ............... 216/67 |
| 2005/0057151 | A1 | * | 3/2005 | Kuwabara ...................... 313/506 |
| 2005/0058785 | A1 | * | 3/2005 | Uhlig et al. ................. 428/32.24 |
| 2005/0282308 | A1 | * | 12/2005 | Uhlig et al. ..................... 438/99 |
| 2006/0035469 | A1 | * | 2/2006 | Truong et al. ................. 438/739 |
| 2007/0111369 | A1 | * | 5/2007 | Chun et al. ...................... 438/99 |
| 2008/0231168 | A1 | * | 9/2008 | Choi ............................. 313/500 |
| 2008/0290790 | A1 | * | 11/2008 | Jin ................................ 313/504 |

OTHER PUBLICATIONS

Lee, H.S. & Yoon, J.-B. "A Simple and Effective Lift-Off with Positive Photoresist." J. Micromech. Microeng., vol. 15 (2005): pp. 2136-2140.*

Smith, H.I., et al. "A High-Yield Photolithographic Technique for Surface Wave Devices." J. Electrochem. Soc., vol. 118 (1971): pp. 821-825.*

Hatzakis, M. "Electron Resists for Microcircuit and Mask Production." J. Electrochem. Soc., vol. 116 (1969): pp. 1033-1037.*

* cited by examiner

*Primary Examiner* — Matthew W Such
(74) *Attorney, Agent, or Firm* — Christie, Parker & Hale, LLP

(57) ABSTRACT

A method of manufacturing an organic light emitting device by which a pixel defining layer can be easily formed. The method includes: forming a first electrode on a substrate; forming a photoresist layer to cover the first electrode; patterning the photoresist layer and forming a blocking layer so that the blocking layer is on a side of the first electrode opposite to a side facing the substrate; forming a pixel defining layer on the substrate to cover side ends of the first electrode; removing the blocking layer and exposing the side of the first electrode contacting the blocking layer; forming an intermediate layer including an organic light emitting layer on the side of the first electrode that is exposed by removing the blocking layer; and forming a second electrode on the intermediate layer.

11 Claims, 4 Drawing Sheets

METHOD OF MANUFACTURING ORGANIC LIGHT EMITTING DEVICE

CROSS-REFERENCE TO RELATED PATENT APPLICATION

This application claims priority to and the benefit of Korean Patent Application No. 10-2008-0074712, filed on Jul. 30, 2008, in the Korean Intellectual Property Office, the disclosure of which is incorporated herein in its entirety by reference.

BACKGROUND OF THE INVENTION

1. Field of the Invention

The present invention relates to an organic light emitting device, and more particularly, to a method of manufacturing an organic light emitting device by which a pixel defining layer can be easily formed.

2. Description of the Related Art

Recently, display devices such as portable display devices and thin flat display devices have been developed. Field emission devices (FEDs), which are a type of flat display device, are self-luminescence display devices having a wide viewing angle, excellent contrast and fast response speed, and thus are considered as next generation display devices. In addition, organic light emitting display devices including a light emitting layer formed of an organic material have higher brightness, a higher driving voltage and faster response time than those of inorganic light emitting display devices.

An organic light emitting display device includes a plurality of organic light emitting devices. Each of the organic light emitting devices includes a cathode, an anode, and an organic light emitting layer which is interposed between the cathode and the anode. The organic light emitting display device may further include a pixel defining layer which defines a plurality of pixels and is formed as an insulating layer so as to prevent shorting of electrodes and to planarize the layers for forming the organic light emitting devices. An organic material or an inorganic material may be used to form the pixel defining layer.

When forming the pixel defining layer, patterning is performed by using photolithography and wet etching so as to form openings for defining pixels, therefore a light emitting layer formed of an organic material may be damaged. In addition, when the pixel defining layer is formed of an inorganic material, it is not easy to perform wet etching and thus, dry etching is performed. However, due to a plasma discharge which occurs during dry etching, the surfaces of electrodes may be damaged, and a characteristic of the organic light emitting device may significantly deteriorate.

SUMMARY OF THE INVENTION

Embodiments of the present invention provide a method of manufacturing an organic light emitting device by which a pixel defining layer can be easily formed without affecting the organic light emitting device.

According to an embodiment of the present invention, there is provided a method of manufacturing an organic light emitting device. The method includes: forming a first electrode on a substrate; forming a photoresist layer to cover the first electrode; patterning the photoresist layer and forming a blocking layer so that the blocking layer is on a side of the first electrode opposite to a side facing the substrate; forming a pixel defining layer on the substrate to cover side ends of the first electrode; removing the blocking layer and exposing the side of the first electrode contacting the blocking layer; forming an intermediate layer including an organic light emitting layer on the side of the first electrode that is exposed by removing the blocking layer; and forming a second electrode on the intermediate layer.

A width of a side of the blocking layer contacting the first electrode may be smaller than a width of the side of the first electrode.

The pixel defining layer may include an inorganic material or a material selected from the group consisting of $SiO_2$, $SiN_x$, $SiON$, and $Al_2O_3$.

A width of a side of the blocking layer opposite to a side contacting the first electrode may be larger than that of the side of the blocking layer contacting the first electrode.

A width of the blocking layer may gradually increase from the side contacting the first electrode toward the side of the blocking layer opposite to the side contacting the first electrode.

The pixel defining layer may have a tapered shaped opening in which its thickness gradually decreases toward a side end of the pixel defining layer, which covers the first electrode.

A total thickness of the first electrode and the blocking layer may be larger than a thickness of the pixel defining layer.

After forming the pixel defining layer, at least a portion of a side of the blocking layer may be exposed.

According to an embodiment of the present invention, a method of manufacturing an organic light emitting device is provided. The method includes: forming a first electrode on a substrate; forming a blocking layer on a side of the first electrode opposite to a side facing the substrate; forming a pixel defining layer on the substrate to cover side portions of the first electrode; removing the blocking layer and exposing the side of the first electrode; forming an intermediate layer including an organic light emitting layer on the side of the first electrode that is exposed by removing the blocking layer; and forming a second electrode on the intermediate layer.

The method may further include forming a photoresist layer to cover the first electrode and patterning the photoresist layer to form the blocking layer.

The pixel defining layer may have a tapered shaped opening exposing the first electrode. A total thickness of the first electrode and the blocking layer may be larger than a thickness of the pixel defining layer. After forming the pixel defining layer, at least a portion of a side of the blocking layer may be exposed.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS

Figure 1:
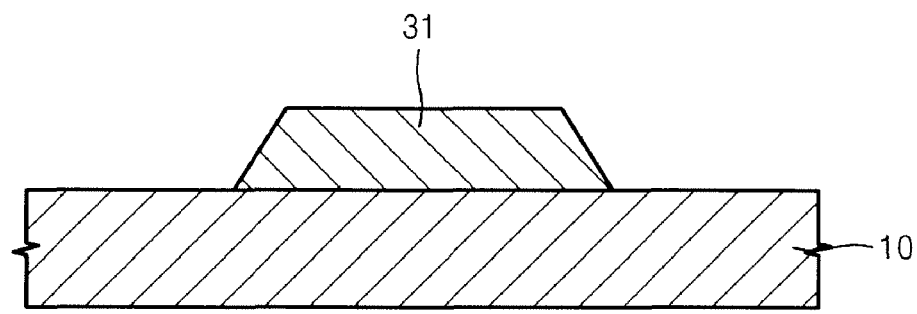
FIGS. 1 through 6 are schematic drawings illustrating cross-sectional views of an organic light emitting device for sequentially illustrating a method of manufacturing the organic light emitting device according to an embodiment of the present invention.

The present invention will now be described more fully with reference to the accompanying drawings, in which exemplary embodiments of the present invention are shown.

FIGS. 1 through 6 are schematic drawings illustrating cross-sectional views of an organic light emitting device for sequentially illustrating a method of manufacturing an organic light emitting device according to an embodiment of the present invention. The method of manufacturing an organic light emitting device according to the current embodiment includes forming a first electrode 31 on a substrate 10, forming a blocking layer 45 on the first electrode 31, forming a pixel defining layer 50 on the substrate 10, and sequentially forming an intermediate layer 32 and a second electrode 33 on the first electrode 31.

Referring to FIG. 1, the first electrode 31 is formed on the substrate 10. The substrate 10 may be formed of transparent glass mainly including $SiO_2$. However, the present invention is not limited to this, and the substrate 10 may be formed of a transparent plastic. The substrate 10 when formed of a transparent plastic may be formed of an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propinonate (CAP). The present invention, however, is not limited to this, and the substrate 10 may be formed of metal, and a thin film transistor (TFT) may be formed on the substrate 10 before the first electrode 31 is formed on the substrate 10. The method of manufacturing an organic light emitting device according to the current embodiment may be used in a method of manufacturing an active organic light emitting device and a method of manufacturing a passive organic light emitting device.

Referring to FIG. 1, the first electrode 31 is formed on a top surface of the substrate 10. The first electrode 31 is formed in a predetermined pattern by using photolithography, for example. The first electrode 31 may be a transparent electrode or a reflective electrode. When the first electrode 31 is a transparent electrode, it may be formed of indium tin oxide (ITO), indium zinc oxide (IZO), ZnO or $In_2O_3$. When the first electrode 31 is a reflective electrode, it may be formed by forming a reflective layer by using a material selected from the group consisting of Ag, Mg, Al, Pt, Pd, Au, Ni, Nd, Ir, Cr, and a compound thereof and then forming a layer on the reflective layer by using ITO, IZO, ZnO or $In_2O_3$.

Figure 2:
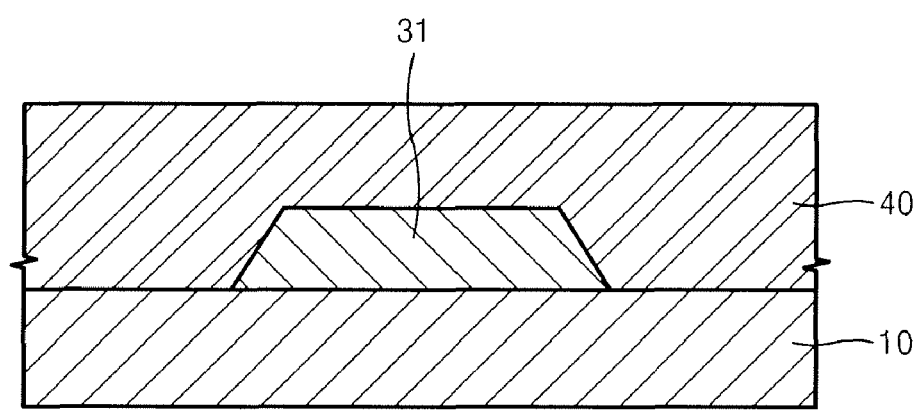

Referring to FIG. 2, a photoresist layer 40 is formed to cover the first electrode 31 after the first electrode 31 is formed on the substrate 10. The photoresist layer 40 may be formed of a conventional photoresist material.

Figure 3:
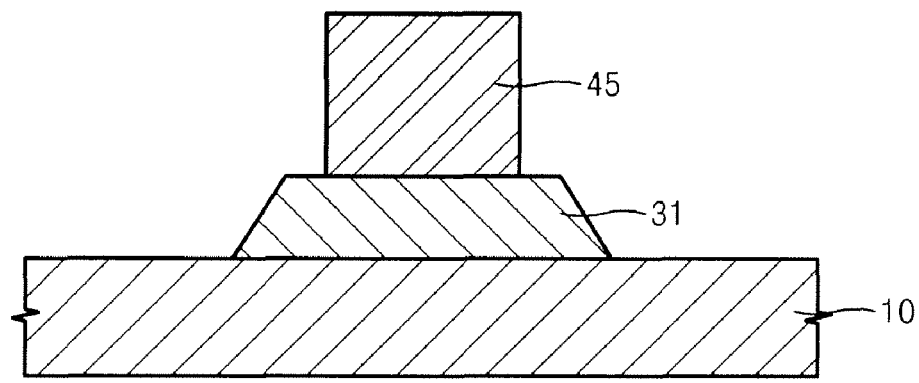

Referring to FIG. 3, the blocking layer 45 is formed by patterning the photoresist layer 40. The blocking layer 45 may be formed by using photolithography. In other words, this structure can be obtained by performing exposure and development processes. In this embodiment, the blocking layer 45 does not contact the substrate 10 and exists only on the first electrode 31. The blocking layer 45 is disposed on a top surface of the first electrode 31. That is, the width of the blocking layer 45 is smaller than the width of the top surface of the first electrode 31, as illustrated in FIG. 3. This is because a side surface of the first electrode 31 is covered by the pixel defining layer 50 in a subsequent process.

Figure 4:
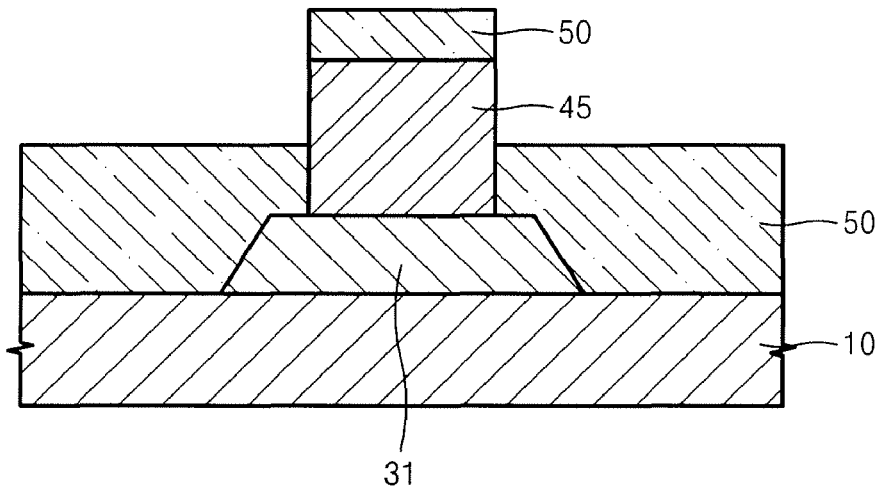

Referring to FIG. 4, the pixel defining layer 50 is formed on the substrate 10 by using an insulating material. The blocking layer 45 is disposed on the top surface of the first electrode 31 so that the side surface of the first electrode 31 is exposed. The pixel defining layer 50 may be formed to cover a side end of the first electrode 31 without using a separate mask. In FIG. 4, the pixel defining layer 50 is also formed on the top surface of the blocking layer 45. However, the pixel defining layer 50 may not be formed on the blocking layer 45 in some embodiments of the present invention. The pixel defining layer 50 does not cover the blocking layer 45 entirely. In other words, the pixel defining layer 50 is formed to expose the side surface of the blocking layer 45 so that the thickness of the pixel defining layer 50 is smaller than the total thickness of the first electrode 31 and the blocking layer 45.

The pixel defining layer 50 may be formed of an inorganic material. For example, the pixel defining layer 50 may be formed of a material such as $SiO_2$, SiNx, SiON or $Al_2O_3$.

Figure 5:
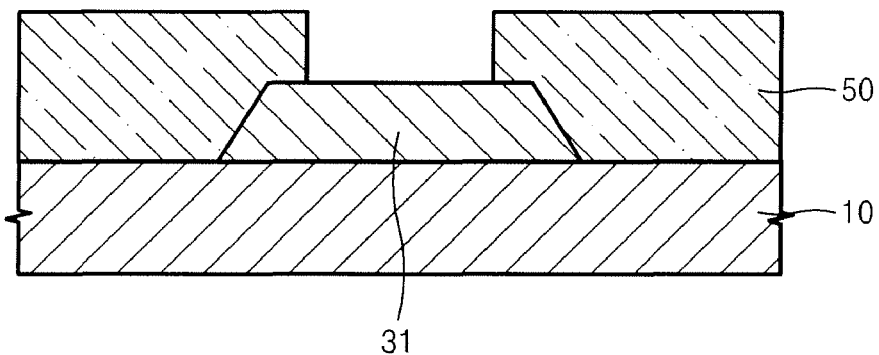

Referring to FIG. 5, the blocking layer 45 is removed by using a strip process. The pixel defining layer 50 does not cover the entire blocking layer 45, and the side surface of the blocking layer 45 is exposed. Thus, a strip liquid may contact the blocking layer 45. When the blocking layer 45 is removed, the top surface of the first electrode 31, i.e., a side of the first electrode 31 opposite to a side facing the substrate 10, is exposed.

Figure 6:
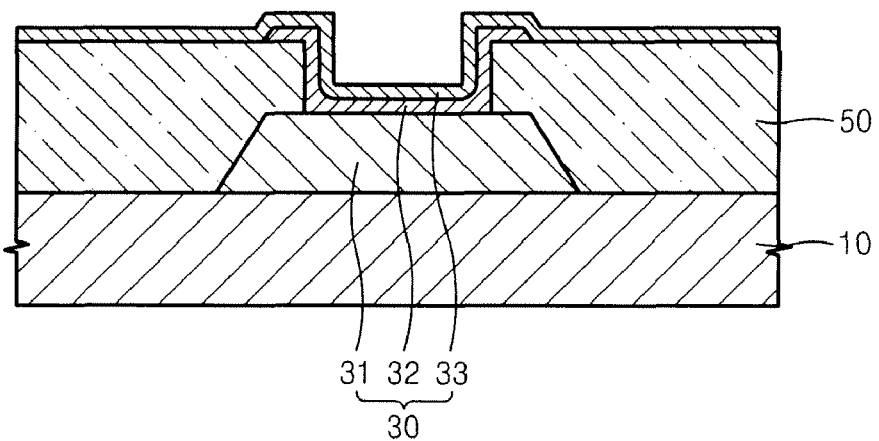

Referring to FIG. 6, the intermediate layer 32 including an organic light emitting layer is formed on the first electrode 31, and a second electrode 33 is formed on the intermediate layer 32.

Therefore, the intermediate layer 32 is interposed between the first electrode 31 and the second electrode 33. The intermediate layer 32 includes an organic light emitting layer and emits light when the first electrode 31 and the second electrode 33 are electrically driven. The intermediate layer 32 may be formed by using a small molecular weight organic material or a polymer organic material. When the organic light emitting layer of the intermediate layer 32 is formed of a small molecular weight organic material, a hole transport layer (HTL), a hole injection layer (HIL), etc. are stacked in a direction toward the first electrode 31 based on a position in which the organic light emitting layer is formed, and an electron transport layer (ETL), an electron injection layer (EIL), etc. are stacked in a direction toward the second electrode 33 based on the position in which the organic light emitting layer is formed. In addition, the organic light emitting layer may include various other stacked layers if necessary. Various organic materials, such as copper phthalocyanine (CuPc), N,N'-Di(naphthalene-1-yl)-N,N'-diphenylbenzidine (NPB), tris-8-hydroxyquinoline aluminum (Alq3), etc. may be used for the organic light emitting layer.

When the organic light emitting layer of the intermediate layer 32 is formed of a polymer organic material, a HTL may be included in a direction toward the first electrode 31 based on a position in which the organic light emitting layer is formed. The polymer HTL may be formed on the first electrode 31 by using inkjet printing or spin coating using poly-(2,4)-ethylene-dihydroxy thiophene (PEDOT) or polyaniline (PANI). The polymer organic light emitting layer may be formed by using PPV, soluble PPVs, cyano-PPV, polyfluorene, etc. Color patterns may be formed by using conventional methods such as inkjet printing, spin coating, thermal transfer using laser, etc.

The second electrode 33 may be formed of a transparent electrode or a reflective electrode. When the second electrode 33 is formed of a transparent electrode, Li, Ca, LiF/Ca, LiF/Al, Al, Mg, or a compound thereof is deposited on the intermediate layer 32, and then auxiliary electrodes or bus electrode lines are formed by using a transparent conductive material such as ITO, IZO, ZnO, $In_2O_3$, etc., thereby forming the second electrode 33. When the second electrode 33 is formed of a reflective electrode, Li, Ca, LiF/Ca, LiF/Al, Al, Mg, or a compound thereof is deposited on the intermediate layer 32, thereby forming the second electrode 33.

A sealing member (not shown) may be disposed to face one side of the substrate 10. The sealing member (not shown) is used to protect an organic light emitting device from external moisture or oxygen, etc. The sealing member (not shown) may be formed of a transparent material. To this end, the sealing member (not shown) may be formed of glass or plastic or may have a structure in which a plurality of organic materials and a plurality of inorganic materials are superimposed.

In the embodiment of the present invention, the pixel defining layer 50 may be easily patterned by using the blocking layer 45 without a separate process, such as photolithography, etc., so that the first electrode 31 is exposed. In particular, when the pixel defining layer 50 is formed by using an inorganic material, an etching rate of an etchant during patterning is not good, and therefore dry etching instead of wet etching is performed. Dry etching may be performed by using plasma. During dry etching, however, the top surface of the first electrode 31 may be damaged so that an electrical characteristic of the organic light emitting device may deteriorate. However, according to the embodiment of the present invention, the pixel defining layer 50 may be easily patterned by first forming the blocking layer 45 on the first electrode 31 by using the photoresist layer 40 without a separate process.

FIGS. 7 through 10 are schematic drawings illustrating cross-sectional views of an organic light emitting device for sequentially illustrating a method of manufacturing an organic light emitting device according to another embodiment of the present invention. The method of manufacturing an organic light emitting device according to the current embodiment includes forming a first electrode 131 on a substrate 110, forming a blocking layer 145 on the first electrode 131, forming a pixel defining layer 150 on the substrate 110, and sequentially forming an intermediate layer 132 and a second electrode 133 on the first electrode 131. Hereinafter, differences between the aforementioned embodiment of FIGS. 1 through 6 and the current embodiment will be described.

Figure 7:
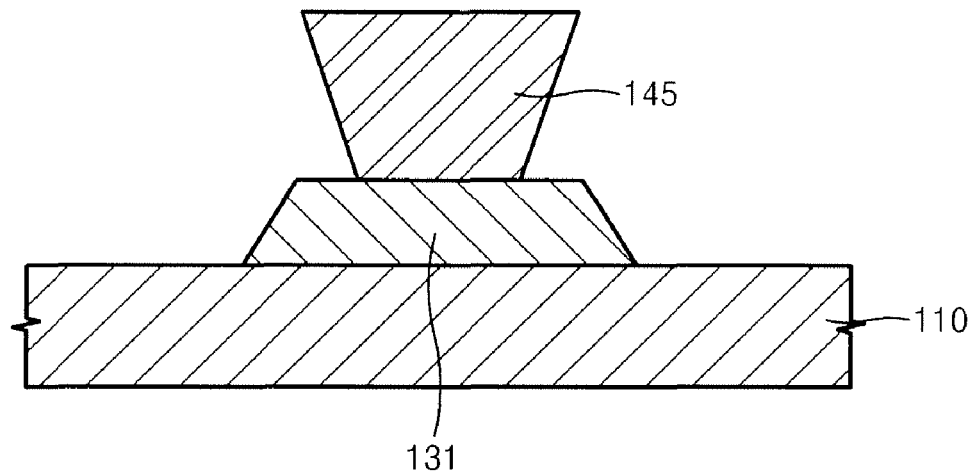
FIGS. 7 through 10 are schematic drawings illustrating cross-sectional views of an organic light emitting device for sequentially illustrating a method of manufacturing the organic light emitting device according to another embodiment of the present invention.

Referring to FIG. 7, the first electrode 131 and the blocking layer 145 are formed on the substrate 110. The substrate 110 may be formed of transparent glass mainly including $SiO_2$. The present invention, however, is not limited to this, and the substrate 110 may be formed of a transparent plastic or metal. A thin film transistor (TFT) may be formed on the substrate 110 before the first electrode 131 is formed on the substrate 110. The method of manufacturing an organic light emitting device according to the current embodiment may be used in a method of manufacturing an active organic light emitting device and a method of manufacturing a passive organic light emitting device.

The first electrode 131 is formed in a predetermined pattern by using photolithography, for example. The first electrode 131 may be a transparent electrode or a reflective electrode. When the first electrode 131 is a transparent electrode, it may be formed of indium tin oxide (ITO), indium zinc oxide (IZO), ZnO or $In_2O_3$. When the first electrode 131 is a reflective electrode, it may be formed by forming a reflective layer by using a material selected from the group consisting of Ag, Mg, Al, Pt, Pd, Au, Ni, Nd, Ir, Cr, and a compound thereof, and then forming a layer on the reflective layer by using ITO, IZO, ZnO or $In_2O_3$.

The blocking layer 145 is formed on the first electrode 131 to cover the first electrode 131. Although not shown, the blocking layer 145 according to the current embodiment is formed by patterning a photoresist layer (not shown) like in the aforementioned embodiment. The blocking layer 145 may be formed of a conventional photoresist material. The blocking layer 145 exists only on the first electrode 131. The blocking layer 145 is disposed on a top surface of the first electrode 131. That is, the width of the blocking layer 145 is smaller than the width of the first electrode 131, as illustrated in FIG. 7. Further, a side surface of the first electrode 131 is covered by the pixel defining layer 150 in a subsequent process.

The blocking layer 145 is formed so that its width is gradually increased toward its top surface which is opposite to the surface contacting the first electrode 131, from the surface contacting the first electrode 131. In other words, the blocking layer 145 is formed to have a tapered shape. The structure of the blocking layer 145 may be formed by using exposure and development processes. That is, the blocking layer 145 may be formed by adjusting the type and components of a developing agent. For example, the blocking layer 145 may be formed to have the tapered shape by using a negative photoresist.

Figure 8:
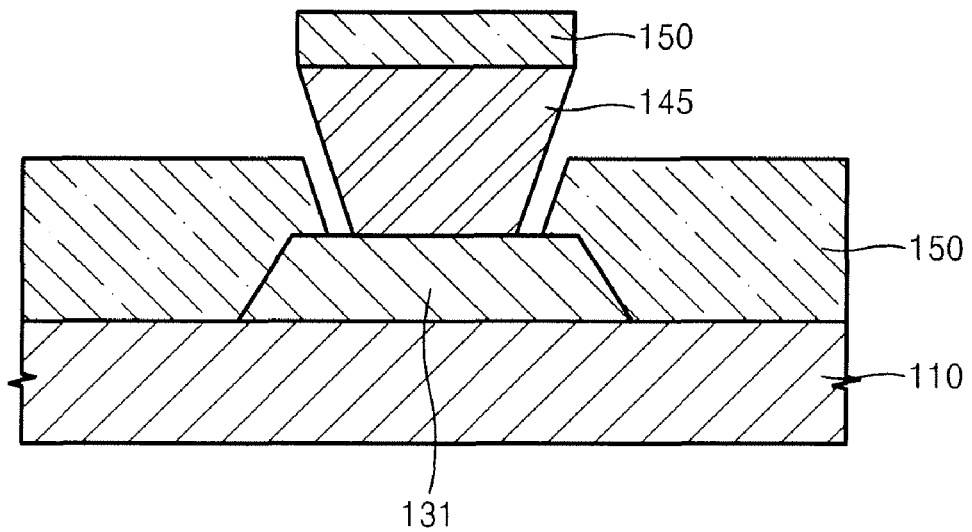

Referring to FIG. 8, the pixel defining layer 150 is formed on the substrate 110 by using an insulating material. The blocking layer 145 is disposed on the top surface of the first electrode 131 so that the side surface of the first electrode 131 is exposed. The pixel defining layer 150 may be formed to cover a side end of the first electrode 131 without using a separate mask. In FIG. 8, the pixel defining layer 150 is also formed on the top surface of the blocking layer 145. However, the pixel defining layer 150 may not be formed on the blocking layer 145. The pixel defining layer 150 does not cover the blocking layer 145 entirely. In other words, the pixel defining layer 150 is formed to expose the side surface of the blocking layer 145 so that the thickness of the pixel defining layer 150 is smaller than the total thickness of the first electrode 131 and the blocking layer 145.

The thickness of the pixel defining layer 150 is decreased toward its side surface covering the first electrode 131. The blocking layer 145 has a tapered shape in which its width is gradually increased toward its top surface. Thus, the pixel defining layer 150 naturally has a tapered shape opening without having to perform a separate process.

The pixel defining layer 150 may be formed by using an inorganic material. The pixel defining layer 150 may be formed by using a material such as $SiO_2$, SiNx, SiON or $Al_2O_3$.

Figure 9:
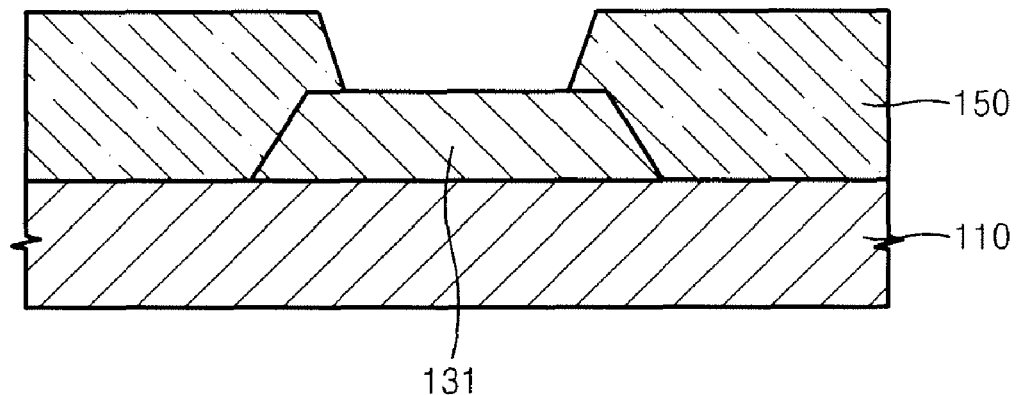

Referring to FIG. 9, the blocking layer 145 is removed by using a strip process. The pixel defining layer 150 does not cover the blocking layer 145 and the side surface of the blocking layer 145 is exposed. Thus, a strip liquid may contact the blocking layer 145. When the blocking layer 145 is removed, the top surface of the first electrode 131, i.e., a side of the first electrode 131 opposite to a side facing the substrate 110, is exposed.

Figure 10:
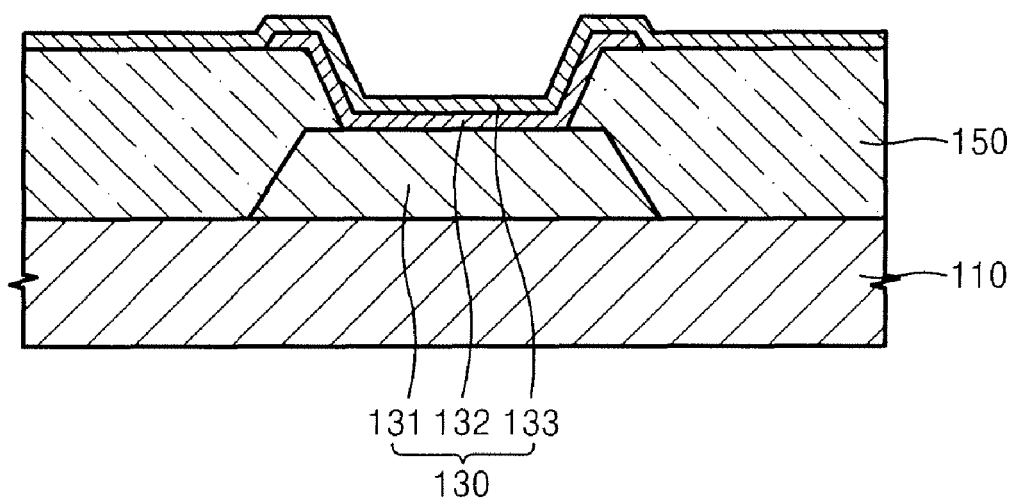

Referring to FIG. 10, the intermediate layer 132 including an organic light emitting layer is formed on the first electrode 131, and a second electrode 133 is formed on the intermediate layer 132.

The intermediate layer 132 is interposed between the first electrode 131 and the second electrode 133. The intermediate layer 132 includes an organic light emitting layer and emits light when the first electrode 131 and the second electrode 133 are electrically driven. The intermediate layer 132 may be formed by using a small molecular weight organic material or a polymer organic material. When the organic light emitting layer of the intermediate layer 132 is formed of a small molecular weight organic material, a hole transport layer (HTL), a hole injection layer (HIL), etc. are stacked in a direction toward the first electrode 131 based on a position in which the organic light emitting layer is formed, and an electron transport layer (ETL), an electron injection layer (EIL), etc. are stacked in a direction toward the second electrode 133 based on the position in which the organic light emitting layer is formed. In addition, various other layers may be stacked if necessary. Various organic materials, such as copper phthalocyanine (CuPc), N,N'-Di(naphthalene-1-yl)-N,N'-diphenyl-benzidine (NPB), tris-8-hydroxyquinoline aluminum (Alq3), etc. may be used.

When the organic light emitting layer of the intermediate layer 132 is formed of a polymer organic material, a HTL may be included in a direction toward the first electrode 131 based on a position in which the organic light emitting layer is formed. The polymer HTL may be formed on the first electrode 131 by using inkjet printing or spin coating using poly-(2,4)-ethylene-dihydroxy thiophene (PEDOT) or polyaniline (PANI). The polymer organic light emitting layer may be formed by using PPV, soluble PPVs, cyano-PPV, polyfluorene, etc. Color patterns may be formed by using conventional methods such as inkjet printing, spin coating, thermal transfer using laser, etc.

In the described embodiment of the present invention, the pixel defining layer 150 may be easily patterned by using the blocking layer 145 without a separate process, such as photolithography, for example, so that the first electrode 131 is exposed. In particular, when the pixel defining layer 150 is formed by using an inorganic material, an etching rate of an etchant during patterning is not good, and dry etching instead of wet etching is performed. When dry etching is performed by using plasma, for example, the top surface of the first electrode 131 may be damaged so that an electrical characteristic of the organic light emitting device may deteriorate. However, according to the embodiment of the present invention, the pixel defining layer 150 may be easily patterned by first forming the blocking layer 145 on the first electrode 131 by using the photoresist layer (not shown) without having to perform a separate process.

In addition, the blocking layer 145 has a tapered shape in which its width is gradually increased toward its top surface. The pixel defining layer 150 naturally has a tapered shape opening in which its thickness is gradually decreased toward a side surface covering the first electrode 131, without having to perform a separate process. Since the pixel defining layer 150 has a tapered shape opening, a step coverage characteristic is improved when the intermediate layer 132 and the second electrode 133 are formed. When the pixel defining layer 150 does not have a tapered shaped opening, the thickness of a side in which the intermediate layer 132 and the first electrode 131 contact each other, is decreased. In this case, a light emitting characteristic of the intermediate layer 132 may deteriorate, and the intermediate layer 132 may not emit light and thus may act as a dark point or pixel. In particular, when the intermediate layer 132 and the second electrode 133 are formed by using a laser thermal transfer method, adhesion characteristics between elements is important. Thus, when the pixel defining layer 150 has a tapered shaped opening, the intermediate layer 132 and the second electrode 133 are safely formed on the first electrode 131, and a contact characteristic therebetween is improved.

A sealing member (not shown) is disposed to face one side of the substrate 110. The sealing member (not shown) is used to protect an organic light emitting device from external moisture or oxygen, etc. The sealing member (not shown) is formed of a transparent material. To this end, the sealing member (not shown) may be formed of glass or plastic or may have a structure in which a plurality of organic materials and a plurality of inorganic materials are superimposed.

As described above, in the method of manufacturing an organic light emitting device according to the embodiments of the present invention, a pixel defining layer can be easily formed, and an electrical characteristic of the organic light emitting device can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. A method of manufacturing an organic light emitting device, the method comprising:
   forming a first electrode on a substrate;
   forming a photoresist layer to cover the first electrode;
   patterning the photoresist layer and forming a blocking layer on and contacting a first side of the first electrode opposite to a second side of the first electrode that faces the substrate;
   forming a pixel defining layer on the substrate to cover side ends of the first electrode, wherein after forming the pixel defining layer, at least a portion of a side of the blocking layer extending from the first side of the first electrode is exposed, and a thickness of a thickest portion of the pixel defining layer is less than a total thickness of the first electrode and the blocking layer;
   removing the blocking layer and exposing the first side of the first electrode while the side ends of the first electrode remain covered by the pixel defining layer;
   forming an intermediate layer comprising an organic light emitting layer on the first side of the first electrode that is exposed by removing the blocking layer; and
   forming a second electrode on the intermediate layer.

2. The method of claim 1, wherein a width of a first side of the blocking layer contacting the first side of the first electrode is smaller than a width of the first side of the first electrode.

3. The method of claim 1, wherein the pixel defining layer comprises an inorganic material.

4. The method of claim 1, wherein the pixel defining layer comprises a material selected from the group consisting of $SiO_2$, $SiN_x$, SiON, and $Al_2O_3$.

5. The method of claim 1, wherein the pixel defining layer has an opening tapering toward the first electrode.

6. A method of manufacturing an organic light emitting device, the method comprising:
   forming a first electrode on a substrate;
   forming a photoresist layer to cover the first electrode;
   patterning the photoresist layer and forming a blocking layer on and contacting a first side of the first electrode opposite to a second side of the first electrode that faces the substrate;
   forming a pixel defining layer on the substrate to cover side ends of the first electrode;
   removing the blocking layer and exposing the first side of the first electrode while the side ends of the first electrode remain covered by the pixel defining layer;
   forming an intermediate layer comprising an organic light emitting layer on the first side of the first electrode that is exposed by removing the blocking layer; and
   forming a second electrode on the intermediate layer, wherein a width of a second side of the blocking layer opposite to a first side contacting the first side of the first electrode is larger than that of the first side of the blocking layer.

7. The method of claim 6, wherein a width of the blocking layer gradually increases from the first side contacting the first side of the first electrode toward the second side of the blocking layer.

8. A method of manufacturing an organic light emitting device, the method comprising:

forming a first electrode on a substrate;

forming a blocking layer on and contacting a first side of the first electrode opposite to a second side thereof facing the substrate;

forming a pixel defining layer on the substrate to cover side portions of the first electrode, wherein after forming the pixel defining layer, at least a portion of a side of the blocking layer extending from the first side of the first electrode is exposed, and a thickness of a thickest portion of the pixel defining layer is less than a total thickness of the first electrode and the blocking layer;

removing the blocking layer and exposing the first side of the first electrode while the side portions of the first electrode remain covered by the pixel defining layer;

forming an intermediate layer comprising an organic light emitting layer on the first side of the first electrode that is exposed by removing the blocking layer; and forming a second electrode on the intermediate layer.

9. The method of claim 8, further comprising:

forming a photoresist layer to cover the first electrode; and patterning the photoresist layer to form the blocking layer.

10. The method of claim 8, wherein the blocking layer has a tapered shape.

11. The method of claim 8, wherein the pixel defining layer has a tapered shape opening exposing the first side of the first electrode.

* * * * *